United States Patent
Kitamura

(10) Patent No.: US 7,102,426 B2
(45) Date of Patent: Sep. 5, 2006

(54) AUDIO REPRODUCING DEVICE AND METHOD, AUDIO AMPLIFIER, AND INTEGRATED CIRCUIT FOR AUDIO AMPLIFIER

(75) Inventor: Mamoru Kitamura, Niigata (JP)

(73) Assignee: Niigata Seimitsu Co., Ltd., (JP)

(*) Notice: Subject to any disclaimer, the term of this patent is extended or adjusted under 35 U.S.C. 154(b) by 89 days.

(21) Appl. No.: 10/740,526

(22) Filed: Dec. 22, 2003

(65) Prior Publication Data

US 2004/0131193 A1    Jul. 8, 2004

Related U.S. Application Data

(63) Continuation of application No. PCT/JP01/05754, filed on Jul. 3, 2001.

(51) Int. Cl.
    *H03F 3/38*    (2006.01)
(52) U.S. Cl. .................................. 330/10; 330/207 A
(58) Field of Classification Search .................. 330/10, 330/207 A
    See application file for complete search history.

(56) References Cited

U.S. PATENT DOCUMENTS 5,777,512 A * 7/1998 Tripathi et al. ......... 330/207 A
6,297,692 B1 * 10/2001 Nielsen ....................... 330/10
6,414,614 B1 * 7/2002 Melanson ................... 341/143
6,765,436 B1 * 7/2004 Melanson et al. ............ 330/10
6,819,912 B1 * 11/2004 Roeckner et al. ........... 455/296

FOREIGN PATENT DOCUMENTS

| EP | 0730344 | 9/1996 |
|---|---|---|
| EP | 0863607 | 9/1998 |
| JP | 61039708 | 2/1986 |
| JP | 07254823 | 10/1995 |
| JP | 2000307359 | 11/2000 |
| WO | WO-0055966 | 9/2000 |

* cited by examiner

*Primary Examiner*—Patricia Nguyen
(74) *Attorney, Agent, or Firm*—Connolly, Bove, Lodge & Hutz LLP

(57) ABSTRACT

A digital ΔΣ modulated signal produced by a quantizer (1c) in a ΔΣ modulation processing unit (1) is put in to a feedback loop before inputted to a power switch (2) and converted into an analog signal by a D/A converter (1d). This analog signal is fed back to the input stage (a differentiator (1a)) of the ΔΣ processing unit (1) to prevent the switching distortion of the power switch (2) itself from being introduced into the feedback loop thereby to suppress the influence of the switching distortion.

11 Claims, 5 Drawing Sheets

F I G. 1
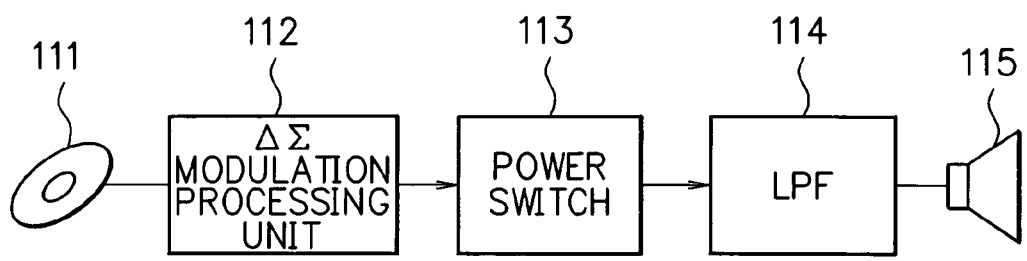
F I G. 2

F I G. 7
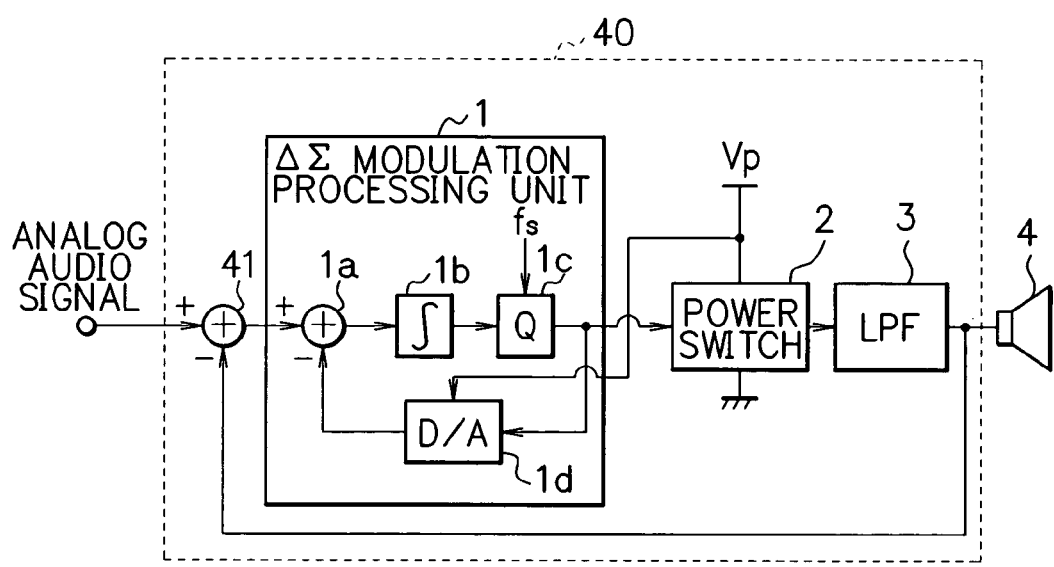

AUDIO REPRODUCING DEVICE AND METHOD, AUDIO AMPLIFIER, AND INTEGRATED CIRCUIT FOR AUDIO AMPLIFIER

BACKGROUND OF THE INVENTION

1. Field of the Invention

The present invention relates to an audio reproducing device and method, audio amplifier, integrated circuit for the audio amplifier, and is preferably used particularly for a digital input type digital amplifier that reproduces digital audio data recorded in a digital signal recording medium such as a CD (compact disk), MD (mini disk), DVD (digital video disk), SACD (super audio CD) or analog input type digital amplifier that amplifies an inputted analog audio signal and outputs it as an analog signal.

2. Description of the Related Art

While a conventional A-class/AB-class amplifier is called an "analog amplifier," a D-class amplifier is called a "digital amplifier" because it has a feature of causing a power MOSFET to perform switching operation to drive a speaker. The digital amplifier has better power efficiency than a conventional analog amplifier. Thus, against a background of demands for miniaturization and low power consumption of audio devices in recent years, a growing number of audio devices use digital amplifiers.

A digital amplifier uses mainly two systems; PWM (Pulse Width Modulation) system and $\Delta\Sigma$ (delta sigma) system. The PWM system is a system that compares the amplitude of an analog audio signal with that of a triangular waveform, generates a pulse width modulated PWM signal and uses the PWM signal to switch a power MOSFET. On the other hand, the $\Delta\Sigma$ system is a system that has developed a $\Sigma$ modulation, which is one of A/D conversion systems, integrates the inputted audio signal, quantizes its result and uses the resulting $\Delta\Sigma$ modulated signal to switch the power MOSFET. Compared to the PWM system, most part of which is constructed of analog circuits, the $\Delta\Sigma$ system is characterized by having fewer factors of deterioration of sound quality such as noise and distortion.

A PCM multi-bit system (hereinafter abbreviated as "PCM system") has been conventionally used as means for expressing audio information which is originally an analog signal using a digital signal. CDs which are widely used today also adopt this PCM system. The PCM system performs calculation at every timing of a sampling frequency (44.1 kHz) according to a quantization characteristic, replaces an analog signal by a digital signal and records the absolute amount of data at all sampling points in a CD.

On the other hand, a 1-bit system is a focus of attention recently which improves recoverability from a digital signal to the original analog signal by controlling a quantization noise distribution using $\Delta\Sigma$ modulation compared with the PCM system. The 1-bit system only records a variation from immediately preceding data as a binary signal and uses no thinning or interpolation of an amount of information as in the PCM system, and therefore the 1-bit signal resulting from quantization has a characteristic extremely close to an analog signal.

Therefore, unlike the PCM system, an audio reproducing device (digital power amplifier) based on a 1-bit system, a so-called 1-bit amplifier, needs no D/A converter and has the merit of being capable of reproducing the original analog signal through a simple process of only removing a digital signal of a high frequency component using a low pass filter at the final stage.

FIG. 1 is a block diagram schematically showing a configuration of a conventional 1-bit amplifier using a $\Delta\Sigma$ system. In FIG. 1, a $\Delta\Sigma$ modulation processing unit 112 carries out conversion processing based on $\Delta\Sigma$ modulation on a multi-bit digital audio signal which is reproduced from a CD 111 to obtain a $\Delta\Sigma$ modulated signal (1-bit signal). Then, it outputs the $\Delta\Sigma$ modulated signal obtained as a control signal to drive a power switch (power amplifier) 113.

The power switch 113 is constructed of, for example, a full-bridge switching circuit, controls the time during which each switching element is in an ON state and thereby amplifies the audio signal based on a constant power supply voltage supplied to the power switch 113 and outputs it. The audio signal amplified by this power switch 113 is converted to an analog audio signal through a low pass filter (LPF) 114 and output from a speaker 115.

The digital amplifier shown in this FIG. 1 is of a digital input type, but an analog input type is also constructed roughly in the same way as this.

As stated above, using the 1-bit amplifier in such a configuration can reproduce the original analog signal without carrying out a D/A conversion operation during reproduction with a simple process by only removing a high frequency signal through the low pass filter 114.

However, such a configuration causes the power supply voltage of the power switch 113 which should originally remain at a constant level to fluctuate based on various factors, producing errors and distortion in the amplified audio signal, causing adverse effects on the sound quality of a reproduced sound.

For example, when loud sound is output, quite a high current flows into the output impedance of the power supply and the power supply voltage reduces. When the power supply voltage is reduced, the output level of the audio signal reaches the ceiling, is clipped and its waveform is distorted. Furthermore, even when a relatively small sound is output, if a sharp rising or falling audio signal is output, the power supply voltage falls or rises, causing distortion in the output waveform.

Furthermore, the MOSFET used for the power switch 113 is driven at relatively low impedance. Therefore, as shown in FIG. 2, a slowdown (dotted line) occurs in the switching characteristic at a relatively low speed, which is different from an ideal switching characteristic (solid line). However, the calculation unit of the $\Delta\Sigma$ modulation processing unit 112 performs quantization assuming that the switching characteristic of the power switch 113 is ideal. Therefore, if the switching characteristic has a slowdown, it is not possible to generate a voltage at a precise level, producing distortion in the output waveform. Especially when large output power is obtained, the distortion increases considerably.

Thus, to solve such a problem, a digital amplifier is provided adapted to cause the output signal of the power switch 113 producing variation in the power supply voltage or slowdown of the switching characteristic to be fed back to the $\Delta\Sigma$ modulation processing unit 112 and correct the variation in the power supply voltage or deviation from the ideal switching characteristic, etc., using this feedback signal in real time.

By applying similar feedback control not only to a $\Delta\Sigma$ system digital amplifier but also to a PWM system digital amplifier, the pulse width of a PWM signal is corrected by a feedback signal.

However, when the signal is fed back from the output stage of the power switch 113, there is a problem that under the influence of transient state variations of the MOSFET that carries out switching, corrections are not performed successfully, producing distortion in the output waveform.

The present invention has been implemented to solve such problems and it is an object of the present invention to make it possible not only to suppress deterioration of sound quality of reproduced sound caused by variations in the power supply voltage or deviation from an ideal switching characteristic of the power switch but also to suppress deterioration of sound quality of reproduced sound caused by the switching operation itself of the power switch.

SUMMARY OF THE INVENTION

The audio reproducing device of the present invention comprises modulation processing means for carrying out conversion processing based on modulation on an inputted audio signal and generating a modulated signal, amplification means for amplifying the audio signal based on the modulated signal generated by the modulation processing means, filtering means for generating an analog audio signal by carrying out filtering on the signal outputted from the amplification means and correction means for causing the output signal of the modulation processing means to be fed back to the modulation processing means and correcting the modulated signal using the signal fed back.

Another aspect of the present invention further comprises second correction means for causing the detected signal of the power supply voltage of the amplification means to be fed back to the modulation processing means and correcting the modulated signal using the signal fed back.

A further aspect of the present invention further comprises third correction means for causing the output signal of the filtering means to be fed back to the modulation processing means and correcting the modulated signal using the signal fed back.

Here, the modulation processing means is provided with at least one of $\Delta\Sigma$ modulation processing means for carrying out modulation processing based on $\Delta\Sigma$ modulation or pulse width modulation processing means for carrying out conversion processing based on pulse width modulation.

The audio reproducing method of the present invention is an audio reproducing method that amplifies an audio signal according to a modulated signal generated by carrying out conversion processing based on modulation on the input audio signal and further carrying out filtering processing to output an analog audio signal, wherein the modulated signal generated through conversion processing based on the modulation is fed back to a generation section of the modulated signal and the modulated signal is corrected using the signal fed back.

Another aspect of the present invention causes not only the modulated signal generated through conversion processing based on the modulation but also a detected signal of a power supply voltage used to amplify the audio signal to be fed back to the generation section of the modulated signal and corrects the modulated signal using the signal fed back.

A further aspect of the present invention causes not only the modulated signal generated through conversion processing based on the modulation but also the analog audio signal generated through the filtering processing to be fed back to the generation section of the modulated signal and corrects the modulated signal using the signal fed back.

The audio amplifier of the present invention comprises modulation processing means for carrying out conversion processing on an inputted audio signal based on modulation and generating a modulated signal, amplification means for amplifying the audio signal based on the modulated signal generated by the modulation processing means, filtering means for generating an analog audio signal by carrying out filtering processing on the signal outputted from the amplification means and correction means for causing the modulated signal generated by the modulation processing means to be fed back to the modulation processing means and correcting the modulated signal using the signal fed back.

The integrated circuit for an audio amplifier of the present invention comprises a modulation processing circuit that carries out conversion processing on an inputted audio signal based on modulation and generates a modulated signal, a switching circuit that carries out switching operation based on the modulated signal generated by the modulation processing circuit and amplifies an audio signal, a filter circuit that generates an analog audio signal by carrying out filtering processing on the signal outputted from the switching circuit and a feedback path through which the modulated signal generated by the modulation processing circuit is fed back to the modulation processing circuit.

Another aspect of the present invention further comprises a second feedback path that causes the detected signal of the power supply voltage supplied to the switching circuit to be fed back to the modulation processing circuit.

A further aspect of the present invention comprises a third feedback path that causes the output signal of the filter circuit to be fed back to the modulation processing circuit.

According to the present invention in the above-described configuration, providing feedback from the input stage of the amplification means causes the amplification means to exit from the feedback loop. This prevents switching distortion of the amplification means itself from being introduced into the feedback loop, thereby suppressing the influence of the switching distortion. Therefore, it is possible to simply and reliably suppress deterioration of sound quality of reproduced sound caused by the switching operation itself of the amplification means.

Furthermore, according to another feature of the present invention, the detected signal of the power supply voltage of the amplification means is fed back to the modulation processing means and the feedback signal including errors generated by variations in the power supply voltage of the amplification means or deviation from the ideal switching characteristic, etc., is used to correct the errors and generate a modulated signal, which allows the modulated signal to be corrected in real time.

Furthermore, according to a further feature of the present invention, the output signal of the filtering means is fed back to the modulation processing means, the audio signal including errors generated by variations in the power supply voltage of the amplification means or deviation from the ideal switching characteristic, etc., is fed back and this feedback signal is used to correct the errors, and then a modulated signal is generated, which allows the modulated signal to be corrected in real time.

BRIEF DESCRIPTION OF THE DRAWINGS

FIG. 1 shows a configuration example of a conventional 1-bit amplifier;

FIG. 2 shows a switching characteristic of a power switch;

FIG. 7 shows a configuration example of a digital amplifier according to a fourth embodiment using a ΔΣ modulation system.

DETAILED DESCRIPTION OF THE
PREFERRED EMBODIMENTS

[First Embodiment]

A first embodiment of the present invention will be explained based on the attached drawings below.

Figure 3:
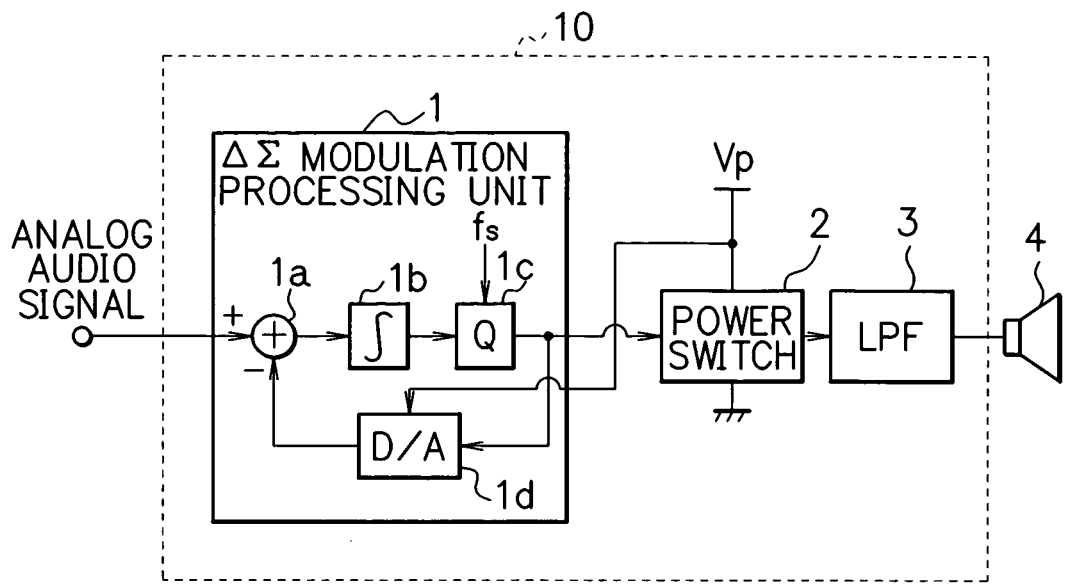
FIG. 3 shows a configuration example of a digital amplifier according to a first embodiment using a $\Delta\Sigma$ modulation system.

FIG. 3 is a configuration example of a digital amplifier according to a first embodiment using a ΔΣ modulation system. The digital amplifier shown in FIG. 3 is an example when an analog audio signal is inputted.

A digital amplifier 10 shown in FIG. 3 is provided with a ΔΣ modulation processing unit 1, a power switch 2 and an LPF 3. Furthermore, the ΔΣ modulation processing unit 1 is provided with a differentiator 1a, an integrator 1b, a quantizer 1c and a D/A converter 1d.

The differentiator 1a in the ΔΣ modulation processing unit 1 subtracts an analog signal fed back from the output stage (the input stage of the power switch 2) of the quantizer 1c through the D/A converter 1d from the inputted analog audio signal and generates a differential signal. The differential signal generated here is supplied to the integrator 1b.

The integrator 1b generates the output signal of the differentiator 1a. Here, only one integrator 1b is connected, but cascading n integrators allows a ΔΣ modulation of the n-th degree.

The quantizer 1c generates a ΔΣ modulated signal by quantizing the output signal of the integrator 1b according to a sampling frequency fs. The quantizer 1c then outputs the ΔΣ modulated signal generated as a control signal to drive the switching of the power switch 2.

The power switch 2 is constructed of a full-bridge switching circuit using, for example, power MOSFETs and amplifies and outputs an audio signal based on a constant power supply voltage VP supplied to the power switch 2 by controlling the time during which each MOSFET is in an ON-state.

The audio signal amplified by the power switch 2 is converted to an analog audio signal through the LPF 3 and outputted from a speaker 4.

As shown in FIG. 3, this embodiment puts a digital ΔΣ modulated signal which is generated by the quantizer 1c in the ΔΣ modulation processing unit 1 into a feedback loop before being inputted to the power switch 2, converts the signal to an analog signal through the D/A converter 1d and causes the analog signal to be fed back to the input stage (differentiator 1a) of the ΔΣ modulation processing unit 1.

Thus, causing the signal to be fed back from the input stage of the power switch 2 prevents switching distortion of the power switch 2 itself from being introduced into the feedback loop and suppresses the influence of the switching distortion.

The switching performance of power MOSFETs is improving in recent years and MOSFETs which may not have a perfect ideal form (solid line in FIG. 2) but have a quasi-perfect characteristic is being provided. Therefore, using such a switching element, the signal need not always be fed back from the output stage of the power switch 2.

Furthermore, even if it is not an element having a quasi-ideal switching characteristic, for applications not requiring large output power (e.g., output power on the order of several watts to several tens of watts of a mini compo, mini disk player, personal computer, cellular phone, PDA (Personal Digital Assistants)), the presence of slowdown in some degree shown by the dotted line in FIG. 2 does not cause serious distortion on output sound. Thus, in such a low output power application, the signal need not always be fed back from the output stage of the power switch 2, but it is possible to form a feedback loop from the input stage of the power switch 2 as shown in FIG. 3.

However, in this case, variations in the power supply voltage Vp in the power switch 2 cannot be corrected. Therefore, as shown in FIG. 3, a separate feedback loop is formed from the power supply voltage Vp of the power switch 2 directly through the D/A converter 1d to the differentiator 1a so that the variations in the power supply voltage Vp can be corrected.

Figure 4:
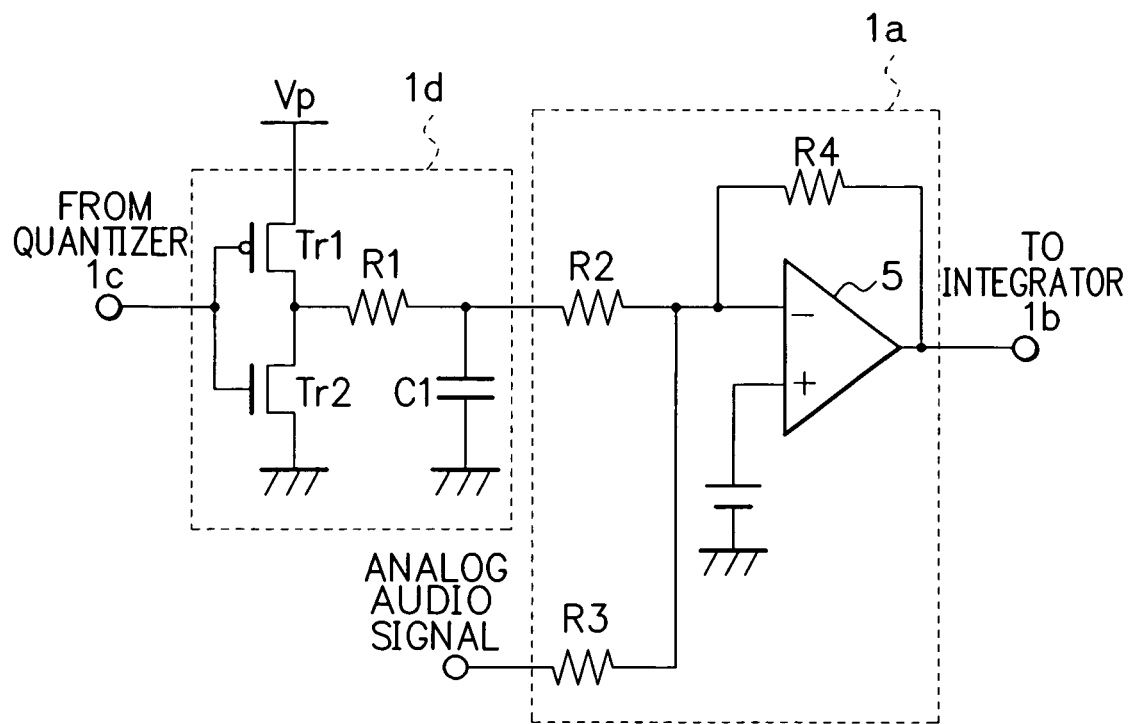
FIG. 4 shows a detailed configuration example of the differentiator and D/A converter shown in FIG. 3.

FIG. 4 is a more detailed configuration example of the differentiator 1a and D/A converter 1d. As shown in FIG. 4, the D/A converter 1d is constructed of an inverter made up of transistors Tr1 and Tr2 and a smoothing circuit made up of a resistor R1 and a capacitor C1.

The source of the pMOS transistor Tr1 making up the inverter is directly connected to the power supply voltage Vp of the power switch 2 and designed to be able to detect the variations in the power supply voltage Vp. Furthermore, the signal fed back from the quantizer 1c to the D/A converter 1d is a 1-bit signal, and therefore an average voltage can be obtained through simple smoothing. This allows the variations in the power supply voltage Vp to be expressed as an average voltage.

On the other hand, the differentiator 1a is constructed of a resistor R2 placed at an interface with the A/D converter 1d, a resistor R3 placed at an input interface with the analog audio signal, a comparator 5 and a resistor R4 that forms negative feedback to the comparator 5.

By inputting the analog audio signal inputted through the resistor R3 and the signal fed back and inputted through the resistor R2 to the negative terminal of the comparator 5 and causing the output of the comparator 5 to be negatively fed back to the same negative terminal, it is possible to suppress the variation component of the power supply voltage Vp.

All or some of the ΔΣ modulation processing unit 1, power switch 2 and LPF 3 making up the digital amplifier 10 can be integrated on the same semiconductor chip. Examples of integrating some of these components include an example of integrating the ΔΣ modulation processing unit 1, the power switch 2 and feedback path and an example of integrating the ΔΣ modulation processing unit 1 and part of the feedback path, etc.

The above-described embodiment has described the analog input type digital amplifier, but the first embodiment can also be applied to a digital input type digital amplifier.

[Second Embodiment]

Figure 5:
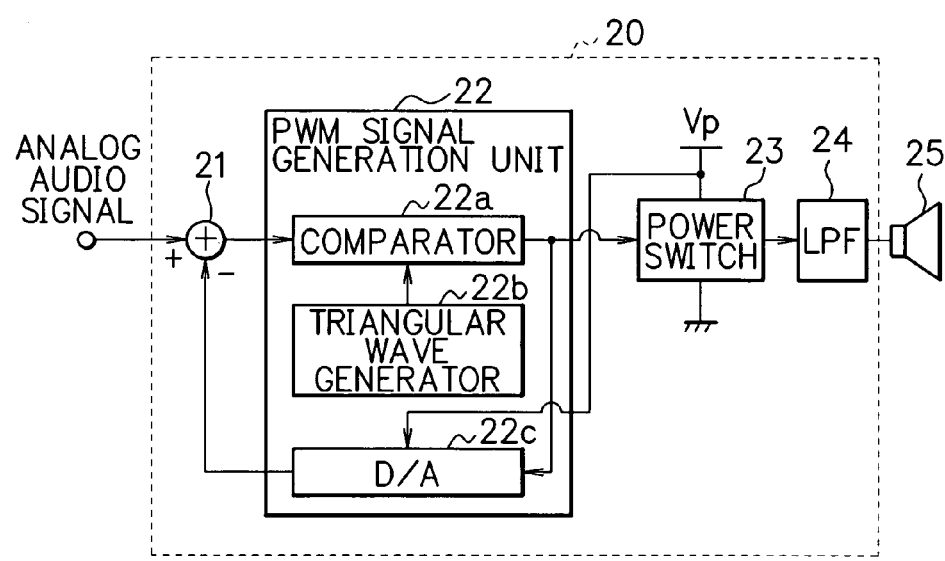
FIG. 5 shows a configuration example of a digital amplifier according to a second embodiment using a PWM system.

FIG. 5 shows a configuration example of a digital amplifier according to a second embodiment using a PWM system. The digital amplifier shown in FIG. 5 also shows an example where an analog audio signal is inputted.

As shown in FIG. 5, a digital amplifier 20 according to the second embodiment comprises a differentiator 21, a PWM signal generation unit 22, a power switch 23 and an LPF 24.

The PWM signal generation unit 22 comprises a comparator 22a, a triangular waveform generator 22b and a D/A converter 22c.

The differentiator 21 subtracts an analog signal fed back from the output stage (input stage of the power switch 23) of the comparator 22a in the PWM signal generation unit 22 from an inputted analog audio signal and generates a differential signal. The differential signal generated here is supplied to the PWM signal generation unit 22. The signal supplied to this PWM signal generation unit 22 has been converted to an audio signal corrected based on the feedback signal from the input stage of the power switch 23.

The comparator 22a in the PWM signal generation unit 22 compares the corrected analog audio signal outputted from the differentiator 21 with the amplitude of the triangular waveform given from the triangular waveform generator 22b and generates a PWM signal subjected to pulse width modulation. Then, the comparator 22a outputs the PWM signal generated as a control signal to drive the switching of the power switch 23.

The power switch 23 consists of a full-bridge switching circuit using, for example, power MOSFETs and controls the time during which each MOSFET is in an ON state and thereby amplifies the audio signal based on a constant power supply voltage Vp supplied to the power switch 23 and outputs it. The audio signal amplified by the power switch 23 is converted to an analog audio signal through the LPF 24 and outputted from a speaker 25.

The second embodiment shown in FIG. 5 puts a digital PWM signal which is generated by the comparator 22a in the PWM signal generation unit 22 into a feedback loop before being inputted to the power switch 23, converts the signal to an analog signal through the D/A converter 22c and causes the analog signal to be fed back to the input stage (differentiator 21) of the PWM signal generation unit 22. This prevents switching distortion of the power switch 23 itself from being introduced into the feedback loop and suppresses the influence of the switching distortion.

Furthermore, a feedback loop from the power supply voltage Vp of the power switch 23 through the D/A converter 22c to the differentiator 21 is also formed. This makes it possible to correct variations in the power supply voltage Vp, and simply and reliably suppress deterioration of sound quality of reproduced sound caused by the variations in the power supply voltage Vp. The D/A converter 22c in this case is constructed in the same way as that shown in FIG. 4.

It is possible to integrate all or some of the differentiator 21, PWM signal generation unit 22, power switch 23 and LPF 24 making up the digital amplifier 20 on the same semiconductor chip. Examples of integrating some components include an example of integrating the differentiator 21, PWM signal generation unit 22, power switch 23 and feedback path and an example of integrating the differentiator 21, PWM signal generation unit 22 and part of the feedback path, etc.

The above-described embodiment has described the analog input type digital amplifier as shown in FIG. 5, but it is also possible to apply the second embodiment to a digital input type digital amplifier.

[Third Embodiment]

Figure 6:
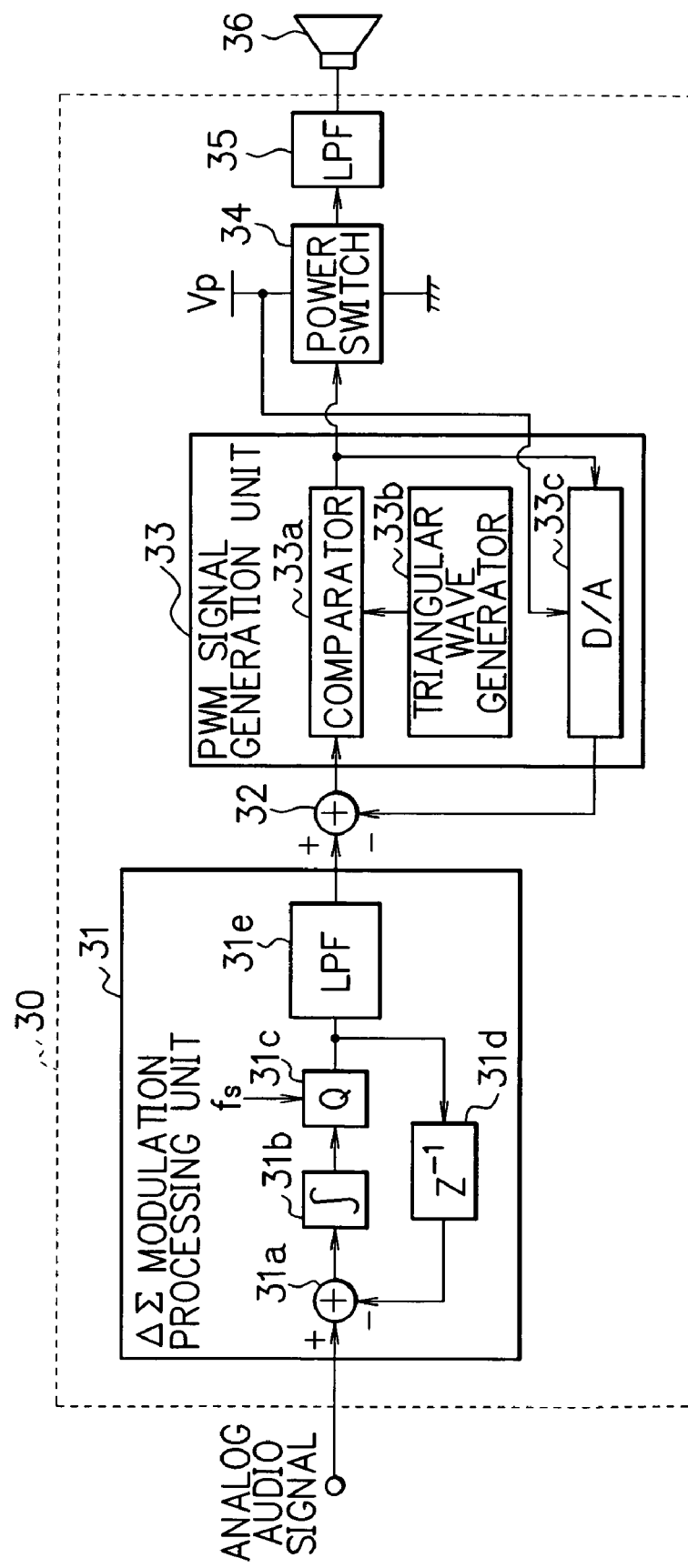
FIG. 6 shows a configuration example of a digital amplifier according to a third embodiment using a system combining ΔΣ modulation and PWM.

FIG. 6 shows a configuration example of a digital amplifier according to a third embodiment using a system combining $\Delta\Sigma$ modulation and PWM. The digital amplifier shown in this FIG. 6 also shows an example where an analog audio signal is inputted.

The digital amplifier 30 shown in FIG. 6 comprises a $\Delta\Sigma$ modulation processing unit 31, a differentiator 32, a PWM signal generation unit 33, a power switch 34 and an LPF 35. The $\Delta\Sigma$ modulation processing unit 31 comprises a differentiator 31a, an integrator 31b, a quantizer 31c, a delayer 31d and an LPF 31e. Furthermore, the PWM signal generation unit 33 comprises a comparator 33a, a triangular waveform generator 33b and a D/A converter 33c.

The differentiator 31a in the $\Delta\Sigma$ modulation processing unit 31 subtracts a signal fed back from the output stage of the quantizer 31c through the delayer 31d from the inputted analog audio signal and generates a differential signal. The differential signal generated is supplied to the integrator 31b.

The integrator 31b integrates the output signal of the differentiator 31a. Here, only one integrator 31b is connected, but cascading n integrators allows a $\Delta\Sigma$ modulation of the n-th degree.

The quantizer 31c generates a $\Delta\Sigma$ modulated signal by quantizing the output signal of the integrator 31b according to a sampling frequency fs. The LPF 31e carries out low pass filter processing on the $\Delta\Sigma$ modulated signal outputted from the quantizer 31c to generate an analog signal. The analog signal generated here is supplied to the differentiator 32.

The differentiator 32 subtracts the analog signal fed back from the output stage (input stage of the power switch 34) of the comparator 33a in the PWM signal generation unit 33 from the analog audio signal inputted from the $\Delta\Sigma$ modulation processing unit 31 and generates a differential signal. The differential signal generated here is supplied to the PWM signal generation unit 33. The signal supplied to this PWM signal generation unit 33 has been converted to an audio signal corrected based on the feedback signal from the input stage of the power switch 34.

The comparator 33a in the PWM signal generation unit 33 compares the corrected analog audio signal outputted from the differentiator 32 with the amplitude of the triangular waveform given from the triangular waveform generator 33b and generates a PWM signal subjected to pulse width modulation. Then, the comparator 33a outputs the PWM signal generated as a control signal to drive the switching of the power switch 34.

The power switch 34 consists of a full-bridge switching circuit using, for example, power MOSFETs and controls the time during which each MOSFET is in an ON state and thereby amplifies the audio signal based on a constant power supply voltage Vp supplied to the power switch 34 and outputs it. The audio signal amplified by the power switch 34 is converted to an analog audio signal through an LPF 35 and outputted from a speaker 36.

The third embodiment shown in FIG. 6 also puts a digital PWM signal which is generated by the comparator 33a in the PWM signal generation unit 33 into a feedback loop before being inputted to the power switch 34, converts the signal to an analog signal through the D/A converter 33c and causes the analog signal to be fed back to the input stage (differentiator 32) of the PWM signal generation unit 33. This prevents switching distortion of the power switch 34 itself from being introduced into the feedback loop and suppresses the influence of the switching distortion.

Furthermore, a feedback loop from the power supply voltage Vp of the power switch 34 through the D/A converter 33c to the differentiator 32 is also formed. This makes it possible to correct variations in the power supply voltage Vp, and simply and reliably suppress deterioration of sound quality of reproduced sound caused by the variations in the power supply voltage Vp. The D/A converter 33c in this case is also constructed in the same way as that shown in FIG. 4.

It is possible to integrate all or some of the ΔΣ modulation processing unit 31, differentiator 32, PWM signal generation unit 33, power switch 34 and LPF 35 making up the digital amplifier 30 on the same semiconductor chip. Examples of integrating some components include an example of integrating components other than the LPF 35 and an example of integrating components other than the LPF 35 and power switch 34 (including part of the feedback path), etc. Furthermore, the ΔΣ modulation processing unit 31 and PWM signal generation unit 33 may be placed on different chips.

[Fourth Embodiment]

FIG. 7 shows a configuration example of a digital amplifier according to a fourth embodiment using a ΔΣ modulation system. In the digital amplifier, components assigned the same reference numerals as those in FIG. 3 have the same functions, and therefore duplicate explanations will be omitted here.

In addition to the ΔΣ modulation processing unit 1, power switch 2 and LPF 3 shown in FIG. 3, the digital amplifier 40 shown in FIG. 7 comprises a differentiator 41 before the ΔΣ modulation processing unit 1.

The differentiator 41 subtracts a signal fed back from the output stage of the LPF 3 from the inputted analog audio signal and generates a differential signal. The differential signal generated is supplied to the ΔΣ modulation processing unit 1. The signal supplied to this ΔΣ modulation processing unit 1 is converted to an audio signal corrected based on the output signal of the LPF 3.

The differentiator 1a in the ΔΣ modulation processing unit 1 subtracts the analog signal fed back from the output stage (input stage of the power switch 2) of the quantizer 1c through the D/A converter 1d from the corrected analog audio signal inputted from the differentiator 41 and generates a differential signal.

The operations of the other integrator 1b, quantizer 1c, D/A converter 1d, power switch 2 and LPF 3 are the same as those described in the first embodiment.

As shown above, in addition to the feedback loop explained in the aforementioned first embodiment, the fourth embodiment forms the feedback loop from the output stage of the LPF 3 to the input stage (differentiator 41) of the ΔΣ modulation processing unit 1, and can thereby correct variations in the power supply voltage Vp of the power switch 2 and deviation, etc., from an ideal switching characteristic and correct switching distortion of the power switch 2 itself in real time. Therefore, this embodiment can simply and reliably suppress deterioration of sound quality of reproduced sound.

Furthermore, unlike the conventional art that forms a feedback loop from the output stage of the power switch 2, this embodiment performs feedback control using the final analog audio signal that has passed through the LPF 3, and can thereby correct errors that occur in the LPF 3, too.

All or some of the differentiator 41, ΔΣ modulation processing unit 1, power switch 2 and LPF 3 making up the digital amplifier 40 can be integrated on the same semiconductor chip. Examples of integrating some of these components include an example of integrating the differentiator 41, ΔΣ modulation processing unit 1, power switch 2 and feedback path and an example of integrating the differentiator 41, ΔΣ modulation processing unit 1 and part of the feedback path.

The above-described embodiment has described the analog input type digital amplifier, but the fourth embodiment can also be applied to a digital input type digital amplifier.

Furthermore, the fourth embodiment is also applicable to the digital amplifier of the PWM system shown in FIG. 5 or the digital amplifier in the system combining ΔΣ and PWM shown in FIG. 6.

Moreover, the above-described embodiments are not more than specific examples in implementing the present invention and this should not be interpreted as restricting the technological scope of the present invention. That is, the invention may be embodied in other specific forms without departing from the spirit or essential characteristic thereof.

INDUSTRIAL APPLICABILITY

The present invention is useful to simply and reliably suppress deterioration of sound quality caused by variations in a power supply voltage or deviation of the power switch from its ideal switching characteristic, etc.

Furthermore, the present invention is also useful to suppress deterioration of sound quality of reproduced sound caused by the switching operation of the power switch itself.

What is claimed is:

1. An audio reproducing device comprising:
    modulation processing means for carrying out conversion processing on an inputted audio signal based on modulation and for generating a modulated signal;
    amplification means for amplifying an audio signal based on the modulated signal generated by said modulation processing means;
    filtering means for generating an analog audio signal by carrying out filtering processing on the signal outputted from said amplification means;
    correction means for causing the output signal of said modulation processing means to be fed beck to said modulation processing means and for correcting said modulated signal using the signal fed back; and
    second correction means for causing a detected signal of a power supply voltage of said amplification means to be fed back to said modulation processing means and for correcting said modulated signal using the signal fed back.

2. The audio reproducing device according to claim 1, further comprising third correction means for causing the output signal of said filtering means to be fed back to said modulation processing means and for correcting said modulated signal using the signal fed back.

3. An audio reproducing method for amplifying an audio signal according to a modulated signal comprising:
    carrying out conversion processing on the input audio signal based on modulation; and
    carrying out filtering processing and thereby outputting an analog audio signal,
    wherein the modulated signal generated through the modulation processing based on said modulation is fed back to a generation section of said modulated signal and said modulated signal is corrected using the signal fed back, and
    wherein, in addition to the modulated signal generated through the conversion processing based on said modulation, a detected signal of a power supply voltage used to amplify said audio signal is also fed back to the generation section of said modulated signal and said modulated signal is corrected using the signal fed back.

4. An audio reproducing method for amplifying an audio signal according to a modulated signal comprising:
    carrying out conversion processing on the input audio signal based on modulation; and further carrying out filtering processing and thereby outputting an analog audio signal, wherein the modulated signal generated through the conversion processing based on said modulation and the analog audio signal generated through said filtering processing are fed back to a generation section of said modulated signal and said modulated signal is corrected using the signal fed back, and wherein, in addition to the modulated signal generated through the conversion processing based on said modulation and analog audio signal generated through said filtering processing, the detected signal of a power supply voltage used to amplify said audio signal is also fed back to the generation section of said modulated signal and said modulated signal is corrected using the signal fed back.

5. An integrated circuit for an audio amplifier characterized by comprising:

a modulation processing circuit that carries out conversion processing on an inputted audio signal based on modulation and generates a modulated signal;

a switching circuit that carries out a switching operation based on the modulated signal generated by said modulation processing circuit and amplifies an audio signal;

a filter circuit that generates an analog audio signal by carrying out filtering processing on the signal outputted from said switching circuit;

a feedback path through which the modulated signal generated by said modulation processing circuit is fed back to said modulation processing circuit; and a second feedback path through which the detected signal of a power supply voltage supplied to said switching circuit is fed back to said modulation processing circuit.

6. The integrated circuit for an audio amplifier according to claim 5, further comprising a third feedback path through which the output signal of said filter circuit is fed back to said modulation processing circuit.

7. An integrated circuit for an audio amplifier used for an audio amplifier comprising:

a modulation processing circuit that carries out conversion processing on an inputted audio signal based on modulation and generates a modulated signal;

a switching circuit that carries out a switching operation based on the modulated signal generated by said modulation processing circuit and amplifies the audio signal;

a filter circuit that generates an analog audio signal by carrying out filtering processing on the signal outputted from said switching circuit; and a feedback path through which the modulated signal generated by said modulation processing circuit is fed back to said modulation processing circuit, characterized by integrating at least said modulation processing circuit, said switching circuit and said feedback path, further characterized by integrating a second feedback path through which the detected signal of a power supply voltage supplied to said switching circuit is fed back to said modulation processing circuit.

8. An audio reproducing device comprising:

modulation processing means for carrying out conversion processing on an inputted analog audio signal based on modulation and for generating a pulse-shaped modulated signal;

amplification means for amplifying an analog audio signal by carrying out filtering processing on the signal outputted from said amplification means; and correction means provided with a feedback loop through which the modulated signal outputted from said modulation processing means is converted to an analog signal by digital/analog conversion means and fed back to the input stage of said modulation processing means far amplifying when said modulated signal is converted to said analog signal, and a separate feedback loop through which a signal in accordance with a power supply voltage of said amplification means is a second signal fed back to the digital/analog conversion means for further correcting said modulated signal using the second signal fed back.

9. The audio reproducing device according to claim 8, wherein said digital/analog conversion means further comprising:

an inverter that inputs the modulated signal outputted from said modulation processing means; and the power supply voltage of said amplification means is supplied to the source of transistor making up said inverter.

10. The audio reproducing device according to claim 1, characterized in that said modulation processing means comprises ΔΣ modulation processing means for carrying out conversion processing based on ΔΣ modulation.

11. The audio reproducing device according to claim 1, characterized in that said modulation processing means comprises pulse width modulation processing means for carrying out conversion processing based on pulse width modulation.

* * * * *